United States Patent [19]

Matsuzawa et al.

[11] Patent Number: 5,019,820

[45] Date of Patent: May 28, 1991

[54] SERIAL-PARALLEL TYPE A/D CONVERTER HAVING REFERENCE RESISTOR CHAIN AND CURRENT SOURCE ARRAY

[75] Inventors: Akira Matsuzawa, Neyagawa; Haruyasu Yamada, Hirakata, both of Japan

[73] Assignee: Matsushita Electric Industrial Co., Ltd., Japan

[21] Appl. No.: 400,311

[22] Filed: Aug. 29, 1989

[30] Foreign Application Priority Data

Aug. 29, 1988 [JP]   Japan .................................. 63-213976

[51] Int. Cl.$^5$ .............................................. H03M 1/14
[52] U.S. Cl. ........................................ 341/156; 341/159
[58] Field of Search ......................... 341/156, 159, 161

[56] References Cited

U.S. PATENT DOCUMENTS

| 3,597,761 | 8/1971 | Fraschilla et al. | 341/159 |
| 4,353,059 | 10/1982 | Vaitkus et al. | 341/159 |
| 4,533,903 | 8/1985 | Yamada et al. | 341/159 |
| 4,542,370 | 9/1985 | Yamada et al. | 341/156 |
| 4,612,531 | 9/1986 | Dingwall et al. | 341/159 |
| 4,635,036 | 1/1987 | Yoshizawa | 341/159 |
| 4,745,393 | 5/1988 | Tsukada et al. | 341/159 |
| 4,816,831 | 3/1989 | Mizoguchi et al. | 341/156 |

Primary Examiner—A. D. Pellinen
Assistant Examiner—Marc S. Hoff
Attorney, Agent, or Firm—Lowe, Price, LeBlanc & Becker

[57] ABSTRACT

A serial-parallel type a/d converter comprises first comparators whose one input is supplied with an input signal, for producing upper-digit signals; a circuit for supplying first different potentials determined according to arithmetic progression with respect to a reference potential to respective another input of the first comparators when the control signal is of first state, and for producing N−1 second different potentials with difference 1/N of voltage difference of first potentials over potential P (N, P: natural numbers) given by the upper-digit signals when the control signal is of second state; and N−1 second comparators whose one input is supplied with the input signal and another input is supplied with the respective second different potentials for producing lower-digit signals. A second a/d converter further comprises a circuit for additional reference potentials and additional comparators to make the lower-digit conversion range larger than one unit of the upper-digit conversion to improve conversion speed limited by settling time. Also, the upper-digit can be corrected by output from additional comparators. The number of comparators is reduced by switches for switching over from upper-digit to lower-digit potentials sent to the comparators.

4 Claims, 9 Drawing Sheets

SERIAL-PARALLEL TYPE A/D CONVERTER HAVING REFERENCE RESISTOR CHAIN AND CURRENT SOURCE ARRAY

BACKGROUND OF THE INVENTION

1. Field of the Invention

This invention relates to a serial-parallel type a/d converter for converting an analog signal into a digital signal.

2. Description of the Prior Art

A serial-parallel type a/d converter converts an analog signal through upper-digit converting and subsequent lower-digit converting steps. FIG. 8 is a block diagram of such serial-parallel type a/d converter. In FIG. 8, an analog input signal 1 is applied to an upper-digit converting block 220. The converted data from the upper-digit converting block 220 is sent to an indicating logic circuit 224 and a d/a converter 221 converting the upper-digit data into another analog signal which is subtracted from the input analog signal by a subtractor 222. The subtracted signal is converted by a lower-digit converting block 223. The logic circuit 224 processes the converted data from the upper-digit and lower digit-converting blocks 220 and 223 to output final data.

Such conventional serial-parallel type a/d converters comprise less comparators than a parallel type a/d converter. However, there are drawbacks that it is necessary to respectively adjust a gain and an offset voltage of the subtractor 222 to full-scale voltage range and offset voltage of the lower-digit converting block 223 accurately; to respectively adjust full-scale voltage range and offset voltage of the d/a converter 221 to those of the upper-digit converting block 220 accurately. Thus, there are many adjusting points so that converting accuracy is unstable among manufactured a/d converters and it is difficult to manufacture this converter as a monolithic integrated circuit. There are also drawbacks that high-speed converting in this conventional a/d converter is difficult because a settling time of the subtractor 222 of an operational amplifier shows long settling time.

SUMMARY OF THE INVENTION

The present invention has been developed in order to remove the above-described drawbacks inherent to the conventional serial-parallel type a/d converter.

According to the present invention there is provided a serial-parallel type a/d converter comprising: plural first comparators whose one input is supplied with an input analog signal to be converted into a digital signal for producing upper-digit signals of the a/d converter; a circuit responsive to a control signal and the upper-digit signals for producing and supplying plural first different potentials determined according to first arithmetic progression with respect to a reference potential to respective another inputs of the first comparators when the control signal is of one state, and for producing $N-1$ (N is a natural number) second different potentials determined according to second arithmetic progression with respect to a potential determined in accordance with the upper-digit signals when the control signal is of another state, common difference of the second arithmetic progression being 1/N of that of the first arithmetic progression; and second comparators whose one input is supplied with the input signal, another inputs of the $N-1$ comparators being supplied with the $N-1$ second potentials respectively for producing lower-digit signals of the a/d converter.

According to the present invention there is also provided a serial-parallel type a/d converter comprising: plural first comparators whose one input is supplied with an analog input signal to be converted for producing upper-digit signals; a circuit responsive to a control signal and the upper-digit signals for producing and supplying plural first different potentials determined according to first arithmetic progression with respect to a reference potential to respective another inputs of first comparators when the control signal is of one state, and for producing $N-1+2Q$ (N and Q are natural numbers) second different potentials determined according to second arithmetic progression with respect to a potential when the control signal is of another state, common difference of the second arithmetic progression being 1/N of that of the first arithemetic progression, the potential given in accordance with the upper-digit signals and with Q/N; $N-1+2Q$ second comparators whose one input is supplied the input signal, another inputs of the $N-1+2Q$ second comparators being supplied with the second potentials respectively for producing lower-digit signals; and a logic circuit responsive to the upper-digit and lower-digit signals for producing an output signal of the a/d converter from the upper-digit and lower-digit signals without correction when least significant digit of the upper-digit signal is consistent with the lower-digit signals and with the upper-digit signal corrected when the least significant digit is inconsistent with the lower-digit signals.

The number of comparators is reduced by switches for switching over from upper-digit to lower-digit potentials sent to the comparators.

BRIEF DESCRIPTION OF THE DRAWINGS

The object and features of the present invention will become more readily apparent from the following detailed description taken in conjunction with the accompanying drawings in which.

The same or corresponding elements or parts are designated at like references throughout the drawings.

DETAILED DESCRIPTION OF THE INVENTION

Figure 1:
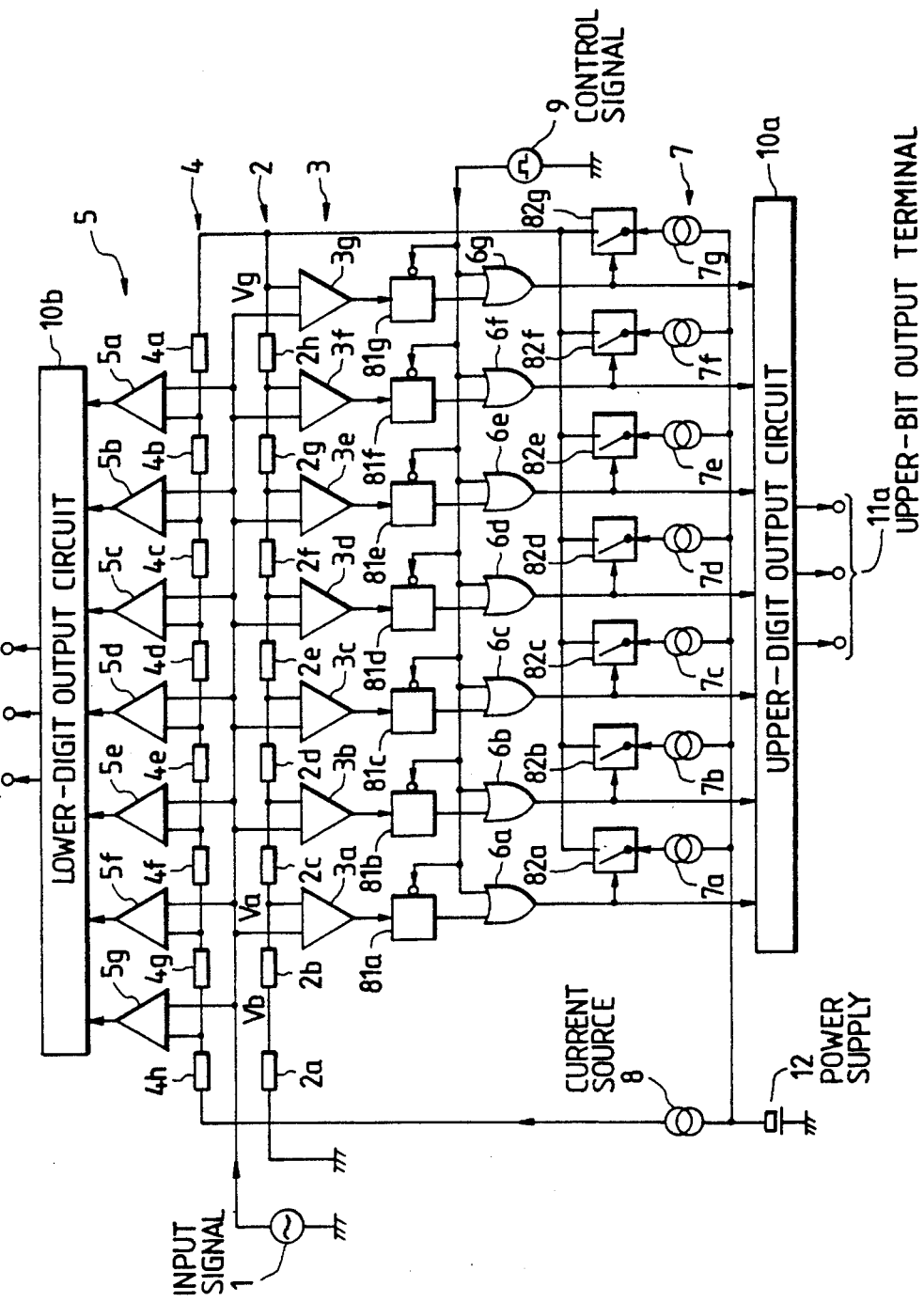
FIG. 1 is a block diagram of a serial-parallel type a/d converter of a first embodiment of the present invention.

Referring now to the drawings, FIG. 1 is a block diagram of a serial-parallel type a/d converter of a first embodiment of the invention.

In FIG. 1, an input signal 1 sampled is applied to one input of comparators 3a to 3g of a first comparator array 3 and comparators 5a to 5g of a second comparator array 5. A first reference resistor array 2 having resistors 2a to 2h series connected, whose one end is connected to the ground or a constant potential and another end is connected to a first current source array 7 having current sources 7a to 7g through switches 82a to 82g. A second reference resistor array 4 having resistors 4a to 4h series connected, whose one end is connected to junction between the first reference resistor array 2 and first current source array 7 and another end is connected to a second current source 8. Another input of each comparators 3a 3g is connected to cascade-junction point of the first reference resistor array 2, as shown. Another input of each comparators 5a to 5g is connected to junction points of the second reference resistor array 4, as shown. Output signals of comparators 3a to 3g are respectively sent to latches 81a to 81g responsive to a control signal 9 for holding levels of the same. An output of each of latches 81a to 81g is sent to an upper-digit output circuit 10a converting data from the latches 81a to 81g, i.e., a thermometer code data, into a binary code data to ouput an upper-digit converted data at terminals 11a. Similarly, an output of each of comparators 5a to 5g is sent to an output circuit 10b converting data from the comparators 5a to 5g, i.e., a thermometer code data, into a binary code data to output a lower-digit converted data at terminals 11b. The first current sources 7a to 7g and second current source 8 are connected to a power supply 12. Each of resistors 2a to 2h and 4a to 4h has a resistance R. Therefore, the first reference resistor array 2 produces different potentials determined according to first arithmetic progression with respect to the ground potential or potential VO and second potential array 4a produces different potentials determined according to second arithmetic progression with respect to the potential Vg. The common difference of the second arithmetic progression is 1/N of that of the first arithmetic progression. Each of current sources 7a to 7h and 8 has a current supply capacity I. Thermometer code is a digital number, each digit thereof having the same weight.

Hereinbelow will be described operation of the serial-parallel type a/d converter of the first embodiment with reference to FIG. 2.

At first step, when the control signal 9 turns to high logic level (H), a current from all current sources 7a to 7g of the first current source 7 flows through the first reference resistor array 2. Therefore, a potential Vg of one end of the second resistor array 4 equals the reference potential Vg and a potential Vbb of another end is larger than the reference potential Vg, as shown in FIG. 2. Assuming that reference potentials of the comparators 3a to 3g are Va to Vg; potential at junction between resistors 2a and 2b is VO; both ends of the second reference resistor array are Vt and Vbb respectively; voltage range of full-scale for a/d converting of the a/d converter is Vl (=Vbb−VO); and voltage range of full-scale for lower-digit a/d converting of the a/d converter is Vs (=Vbb−Vt). There are the following relations:

$$Vt = 8R \times 8I = 64RI \quad (1)$$

$$Vbb = 64RI + 8RI = 72RI \quad (2)$$

$$Vl = 64RI \quad (3)$$

$$Vs = 8RI \quad (4)$$

Figure 2:
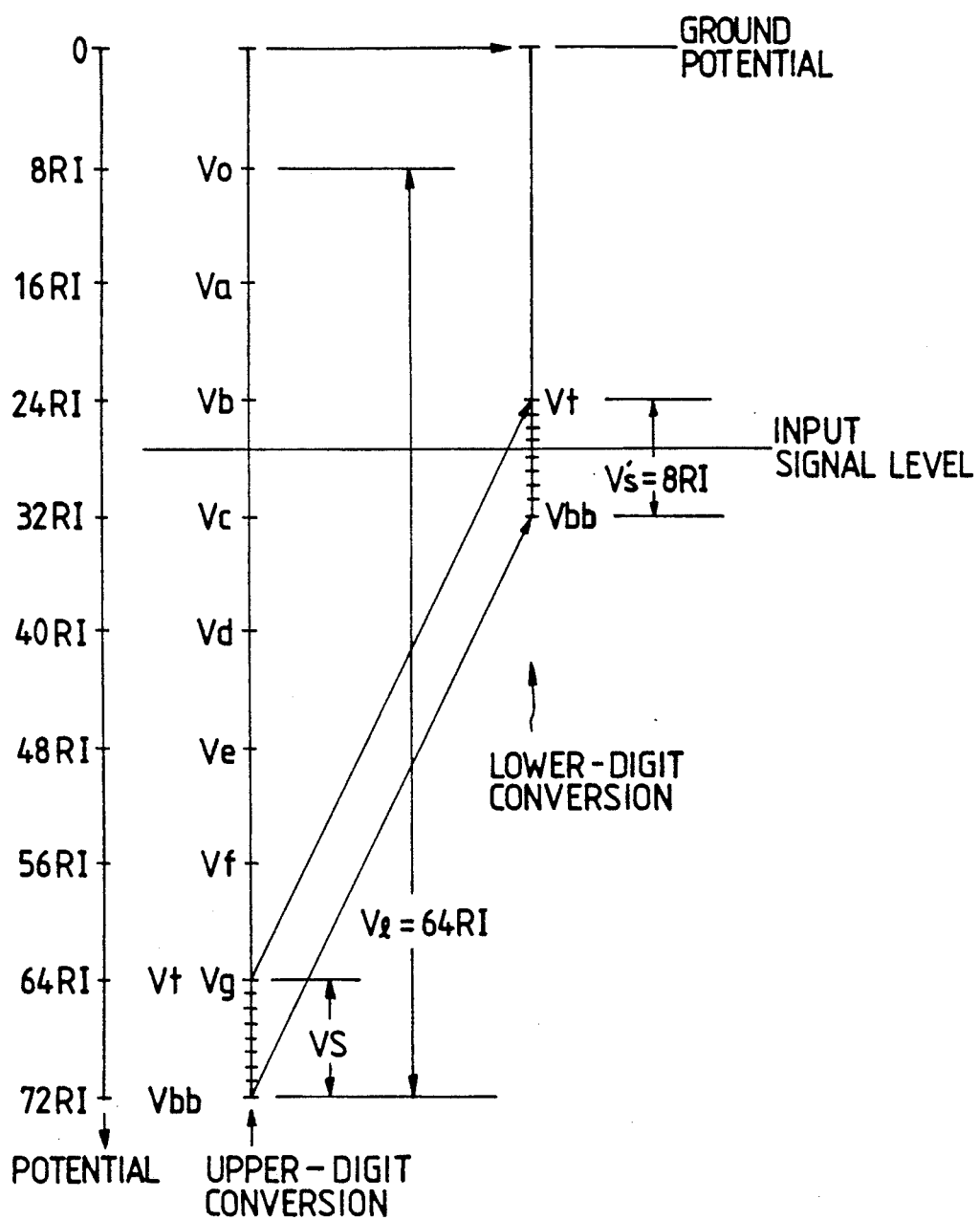
FIG. 2 illustrates an operation of the first embodiment.

These relations are shown in FIG. 2. In FIG. 2, signals from the comparators 3a to 3g provide upper-digit of converted data because reference potentials Va to Vg are respectively given by dividing the full-scale voltage range Vl by eight. Assuming that level of the input signal 1 lies between reference potentials Vb (=24RI) and Vc (=32RI), the input signal 1 is converted into binary number "010" because output signals from the comparators 3a and 3b are "1" and other output signals of the comparators 3c to 6g are "0",. Those output signals from the comparators 3a to 3g are held by the latches 81a to 81g respectively.

At second step, only current source 7a and 7b keeps to supply current to the first reference resistor array 2. Both potentials of the second reference resistor array are given by:

$$Vt = 8R \times 3I = 24RI \quad (5)$$

$$Vbb = 24RI + 8RI = 32RI \quad (6)$$

Those potentials lie between the reference potentials Vb and Vc at this step. Therefore, at this step the input signal 1 lie between those potentials Vt and Vbb of the second reference resistor array because only current sources 7a and 7b out of the first current source array 7 supply a current to the reference resistor array 2. The comparators 5a to 5g convert the input signal into digital data of lower-digit of the a/d converter. In this example of FIG. 2, lower-digit data is "011" and thus, final result is "010011".

As described above, the a/d converter of the first embodiment can provide accurate conversion data of lower-digit data without a subtractor of the conventional serial-parallel type a/d converter by changing reference potential for comparators 5a to 5g. Moreover, this a/d converter is accurate and requires no adjustment because the first and second resistor array 3 and 4 and first and second current sources 7 and 8 are made through the same process such as photolithographic process. Further this a/d converter can operate at a high speed because it has no operational amplifier so that settling of the input signal in this a/d converter is fast. Moreover, this a/d converter operates with low power consumption because this a/d converter comprises no d/a converting block 221 of the conventional serial-parallel type a/d converter. The number of current sources of this a/d converter is more than the conventional serial-parallel type a/d converter but total current required for generating the reference potential is same as the conventional a/d converter.

Figure 3A:
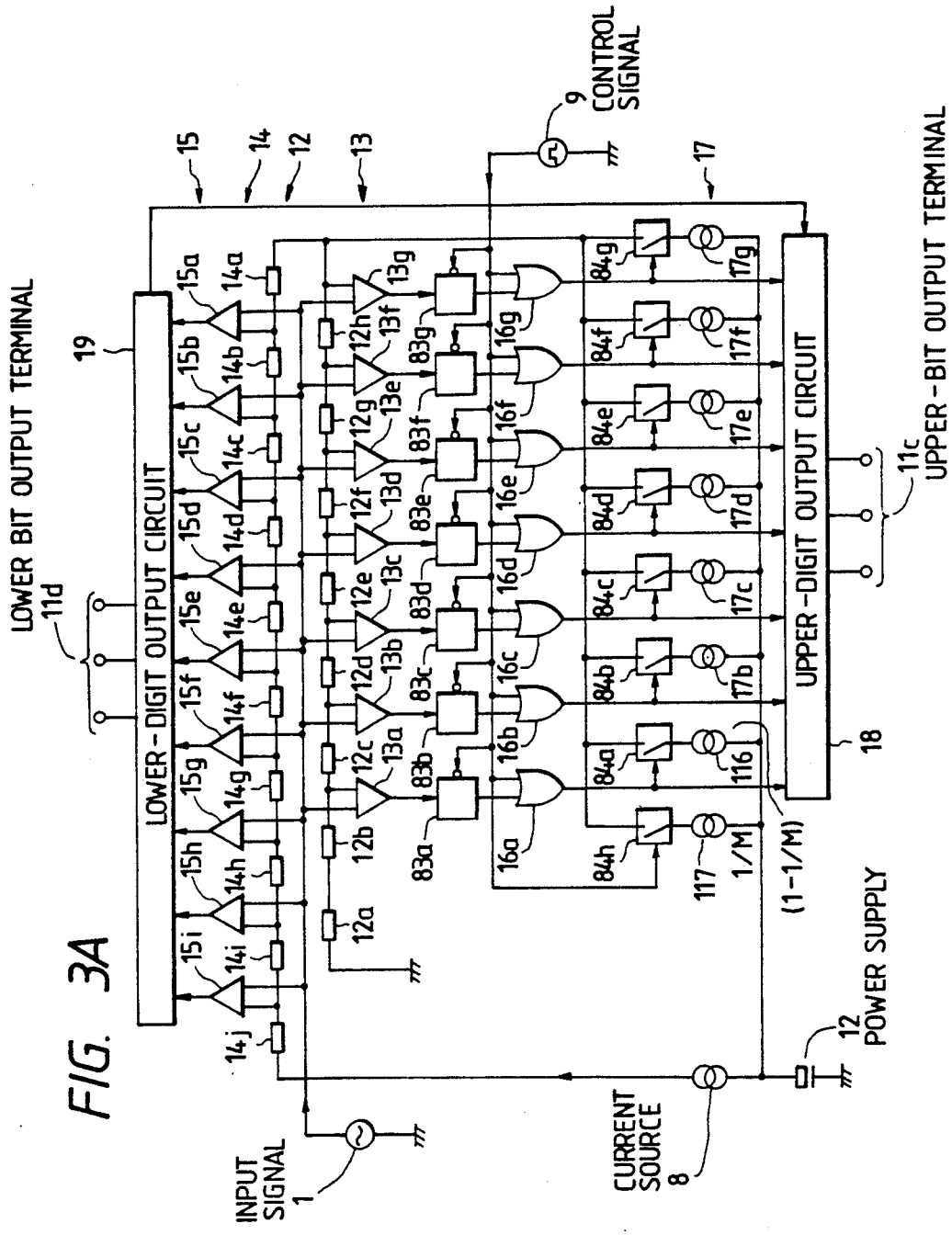
FIG. 3A is a block diagram of a serial-parallel type a/d converter of a second embodiment of the present invention.

FIG. 3A is a block diagram of a serial-parallel type a/d converter of a second embodiment of the invention. In FIG. 3A, an input signal 1 sampled is applied to one input of comparators 13a to 13g of a third comparator array 13 and comparators 15a to 15i of a fourth comparator array 15. A third reference resistor array 12 having resistors 12a to 12h series connected, whose one end is connected to the ground and another end is connected to a third current source array 17 having current sources 117, 116, and 17b to 17g. A fourth reference resistor array having resistors 14a to 14j series connected, whose one end is connected to junction between the third reference resistor array 12 and third current source array 17 and another end, to a fourth current source 8. Another input of each comparators 13a to 13g is connected to junction points of the third reference resistor array 12, as shown. Another input of each comparators 15a to 15i is connected to a junction point of the fourth reference resistor array 14, as shown. Output signals of comparators 13a to 13g are respectively sent to latches 83a to 83g responsive to control signal 9 for holding levels of the same. Output signals of latches 83a to 83g are sent to OR-gates 16a to 16g respectively which turn on 84a to 84g respectively. Output signals of the OR-gates 16a to 16g are sent to an output circuit 18 converting data from the latches 83a to 83g, i.e., a thermometer code data, into a binary code data to output an upper-digit converted data at terminals 11c. Similarly, output signals of comparators 15a to 15i are sent to an output circuit 19 converting a data from the comparators 15a to 15i, i.e., a thermometer code data, into a binary code data to output lower-digit converted data at terminals 11d. The output circuit 19 generates signals indicative of over-range and under-range data. Actually, a signal form the comparator 15i shows over-range data, a signal form the comparator 15a shows under-range data. These over-range and under-range data signals are sent to the output circuit 18. When the over-range data is sent to the output circuit 18, the output circuit 118 add the number "1" to the binary data of upper-digit. When the under-range data is sent to the output circuit 18, the output circuit 18 subtract one from the binary data of upper-digit. The first current sources 17b to 17g and second current source 8 are connected to a power source 12. Each of resistors 12a to 12h and 14a to 14j has a resistance R. Therefore, the third reference resistor array 12 produces different potentials determined according to first arithmetic progression with respect to the ground potential or potential V0 and fourth potential array 14a produces different potentials determined according to third arithmetic progression with respect to the potential Vg. The common difference of the third arithmetic progression is 1/N of that of the first arithmetic progression. Each of current sources 17b to 17g and 18 has a current supply capacity I. However, current sources 117 and 116 have a current supply capacity I/M and (1−1/M)I respectively.

Figure 4:
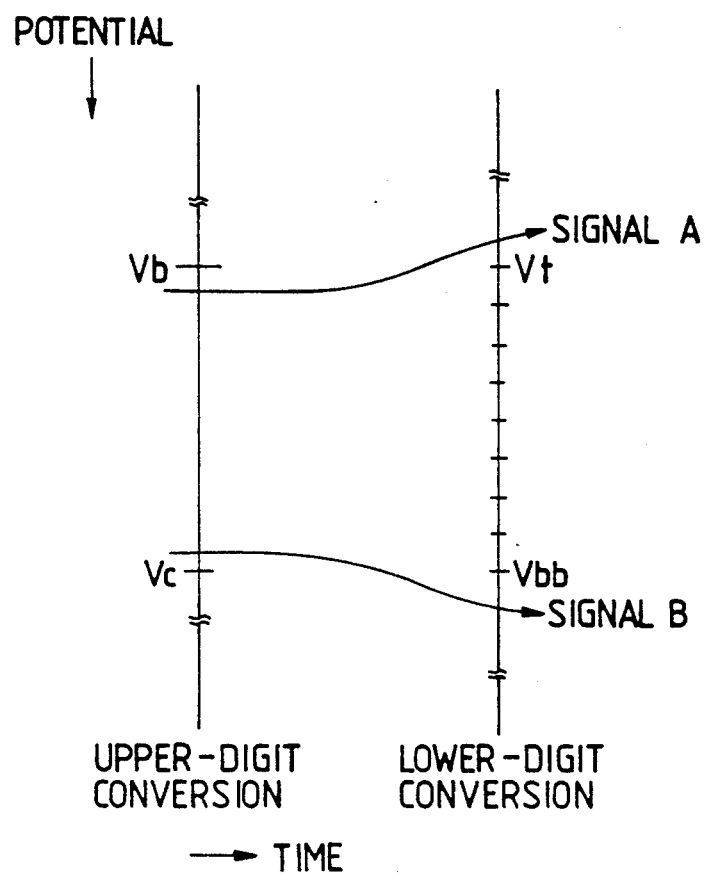
FIGS. 4 and 5 illustrate an operation of the second embodiment.

The object of the a/d converter of the second embodiment is to convert an analog signal into digital at high speed without error due to settling time. Such error is developed as follows:

FIG. 4 shows potential change of comparator input between upper-digit and lower-digit conversions in the serial-parallel type a/d converter of the second embodiment. In a high speed serial-parallel type a/d converter, conversion is done twice so that potential of sampled input signal does not reach the final level at first conversion, i.e., upper-digit conversion. Therefore, the input signal potential changes after first conversion, as shown in FIG. 4. Conversion error due to settling of input signal is developed when the potential of sampled input signal lies near ends of reference potential range, for example, Vb and Vc. At upper-digit conversion, sampled input signal 1 is judged that it lies between the reference potentials Vb and Vc. However, at lower-digit conversion, the signal does not lie between lower-digit reference potential range Vt-Vbb. Therefore, the least significant digit of upper-digit will be incorrect and upper-digit and lower-digit conversion results are inconsistent with each other.

Figure 5:
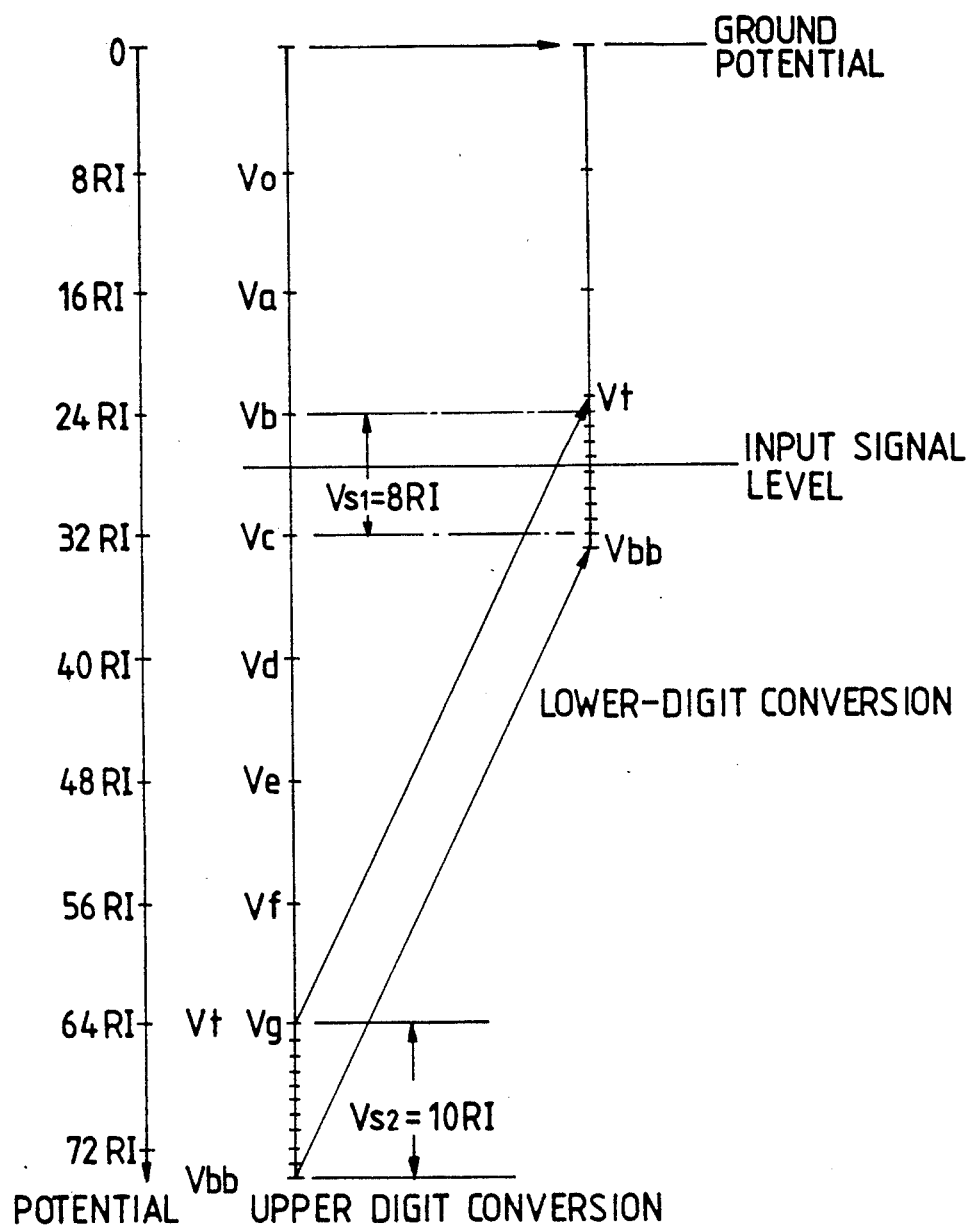

The second embodiment serial-parallel type a/d converter prevents conversion error due to settling time and is capable of high-speed conversion by making the lower-digit reference potential range larger than one unit of upper-digit reference potential range, and making that the lower-digit reference range includes one unit of the upper-digit reference potential range. In FIG. 5, the lower-digit reference potential range Vbb-Vt is larger than one unit of upper-digit reference potential range Vc-Vb by two units of lower-digit conversion range, and that the lower-digit reference range Vbb-Vt includes one unit of the upper-digit reference potential range Vc-Vb.

The serial-parallel type a/d converter of the second embodiment is different from the first embodiment as follows:

The number of the comparators 15a to 15i and reference resistors 14a to 14j is increased. Current intensity capacity of the current source 116 whose reference potential is nearest to the ground potential is (1−1/M) times that of current sources 17b to 17g. An additional current source 117 has current intensity capacity 1/M times that of current sources 17b to 17g. M is given by:

$$M = N/Q$$

where N is the number of sections of a lower-digit conversion stage and Q is a natural number indicative of expansion unit of lower-digit conversion range.

Hereinbelow will be described operation of the serial-parallel type a/d converter of the second embodiment with reference to FIGS. 3A and 5. M is a natural number and is eight as an example in this embodiment.

At first step, when the control signal 9 turns to high logic level (H), current It from all current sources 117, 116, and 17b to 17g of the third current source array 17 flows through the third reference resistor array 12. Current It is given by:

$$It = 7I + (1 - 1/M)I + I/M = 8I \tag{7}$$

Therefore, the comparators 13a to 13g operate in the same way as the first embodiment because reference potentials Va to Vg of comparators 13a to 13g.

At second step, when the control signal 9 turns to L level, current outputs are selected in accordance with result of the comparison of the comparators 16a to 16g and sent to the third resistor array 12. Output of the comparators 13a to 13g turn H level in the order from the comparator 13a in accordance with input analog signal level. Assuming that the number of H-output-level comparators 16a to 16g is J, both potentials Vt and Vbb of the fourth reference resistor array 14 are given by:

$$Vt = 8RI \cdot \{(1 - 1/8) + J\} = 8RI(J+1) - RI: J \geq 1 \tag{8A}$$

$$Vt = 8RI: J = 0 \tag{8B}$$

$$Vbb = Vt + 10RI = 8RI(J+2) + RI: J \geq 1 \tag{9A}$$

$$Vbb = 18RI: J = 0 \tag{9B}$$

Assuming that unit reference voltage range of upper-digit is Vs1; that of lower-digit, Vs2, these are given by:

$$VS1 = 8RI \tag{10}$$

$$VS2 = 10RI \tag{11}$$

As shown in EQs. from (8A) to (11) and FIG. 5, when $J \geq 1$, the lower-digit reference potential range Vbb–Vt is larger than one unit of upper-digit reference potential range Vc–Vb, and the lower-digit reference range Vbb–Vt covers over one unit of the upper-digit reference potential range Vc–Vb. In other words, the reference range of lower-digit is expanded by minimum voltage unit RI at lower and upper ends respectively.

When $J = 0$ an exceptional processing of lower-digit data is made as follows:

Output signals of comparators 15a to 15i are shifted by an unshown switch array so that an output signal of comparator 15a is treated as an output signal of the comparator 15b. Output signal of comparator 15i before sifted is not used. The under-range data signal is not sent to the output circuit 18. The unshown switch array responds to an unshown multi-input OR gate responsive to all output signals of upper-digit signals.

Figure 3B:
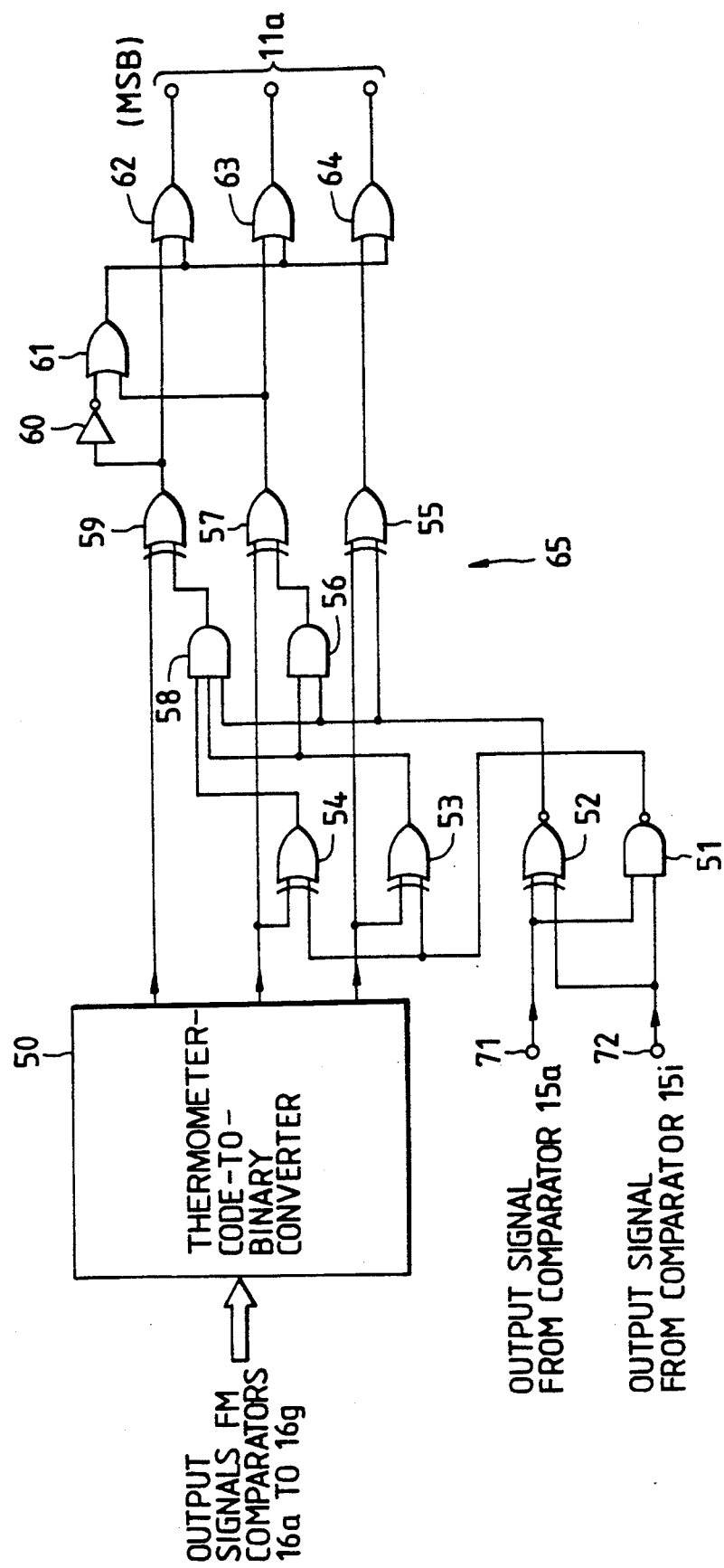
FIG. 3B is a block diagram of an output circuit used in the second embodiment.

FIG. 3B is a block diagram of output circuit 18. In FIG. 3B, output signals from comparators 16a to 16g are applied to a thermometer-code-to-binary-code converter 50 which is well known and converts a thermometer-code data from the comparators 16a to 16g into a binary code data which is correct in the state that conversion error due to settling time does not arise. When the input signal 1 varies between upper-digit and lower-digit conversions, as shown in FIG. 4, output signals of comparators 15a and 15i are sent to terminals 71 and 72 respectively. When the output signal from the comparator 15a indicates under-range, i.e., when input signal change as shown by the signal A of FIG. 4, the logic circuit 65 including integrated circuit (IC) 53 to 64 decreases the converted binary data from the thermometer-code-to binary converter 50 by one. When the output signal from the comparator 15a indicates over-range, i.e., when input signal change as shown by the signal B of FIG. 4, the logic circuit 65 decreases the converted binary data from the thermometer-code-to-binary converter 50 by one. In other words, an upper-digit data is corrected when the result of lower-digit data is inconsistent with the least significant digit of the upper-digit data from comparator 16a to 16g.

As mentioned above, the second embodiment serial-parallel type a/d converter prevents conversion error due to settling time and is capable of high-speed conversion by making the lower-digit reference potential range larger than one unit of upper-digit reference potential range, and that the lower-digit reference range includes one unit of the upper-digit reference potential range.

In the second embodiment, lower-digit conversion range is expanded by one unit voltage RI. The lower-digit conversion range can be expanded further by changing current intensity capacities of current sources 116 and 117 and adding resistors to the resistor array 14 and comparators to the comparator array 17.

Figure 6:
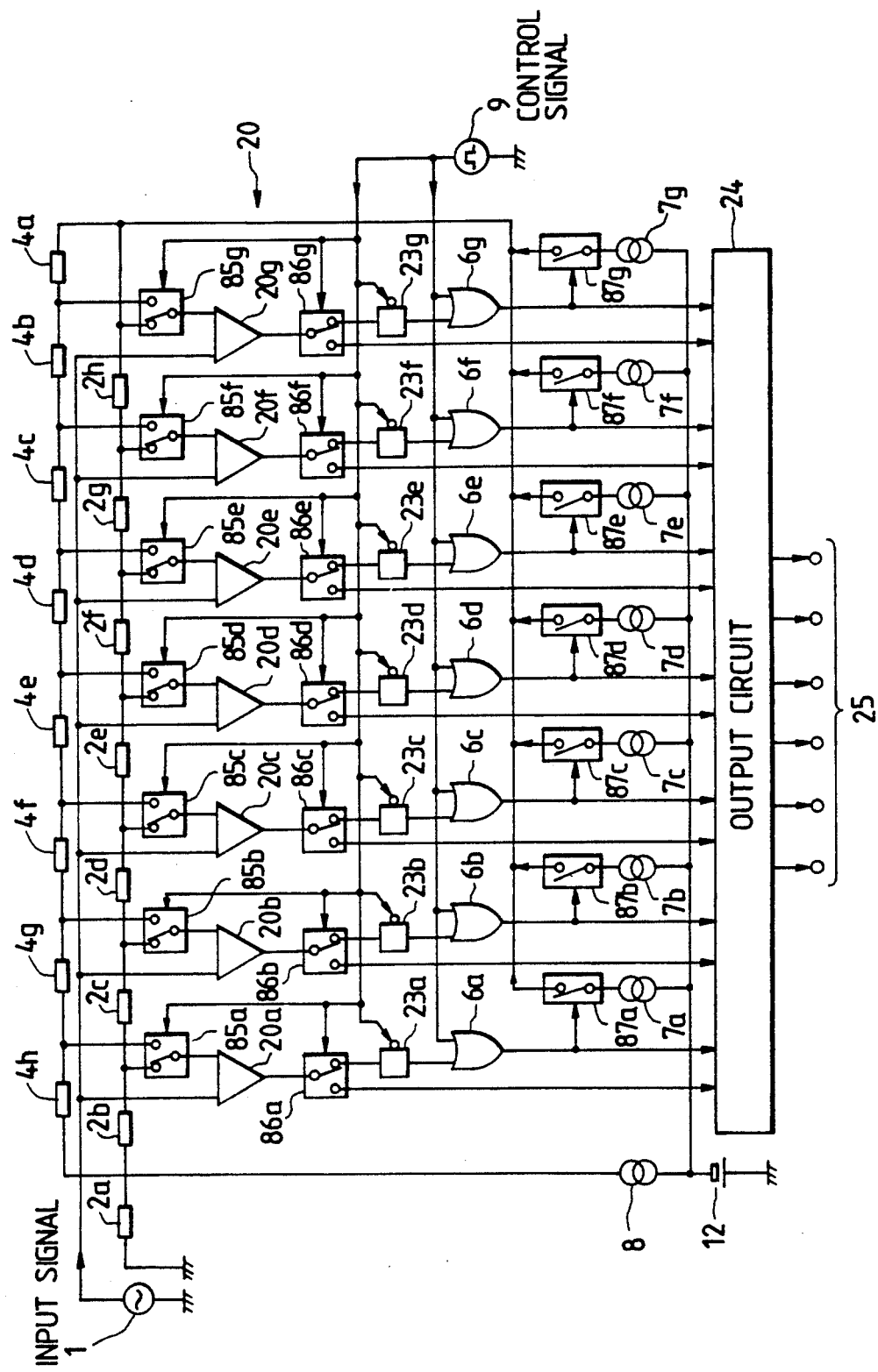
FIG. 6 is a block diagram of a serial-parallel type a/d converter of a third embodiment of the present invention.

FIG. 6 is a block diagram of a serial-parallel type a/d converter of a third embodiment of the invention. In FIG. 6, fundamental structure and operation of this a/d converter are the same as those of the first embodiment except that the second comparator array 5 is not used and switches 86a to 86g and 85a 85g are provided. This is because comparators 20a to 20g are commonly used at upper-digit and lower-digit conversions by selecting upper-digit or lower-digit reference potentials for the comparators 20a to 20g. The switches 85a to 85g and 86a to 86g respond to the control signal 9 which is the same signal as the first embodiment.

At first step, switches 85a to 85g transfer reference potentials from reference resistors 2a to 2h respectively and switches 86a to 86g transfer output signals from the comparators 20a to 20g to latches 23a to 23g and then the sampled input signal 1 is compared by the comparator array 20 to produce an upper-digit result in the same way as the first embodiment.

At second step, the switches 85a to 85g switch over in response to the control signal 9 and then switches 85a to 85g transfer reference potentials from reference resistors 4a to 4h respectively and switches 86a to 86g transfer output signals from the comparators 20a to 20g to output circuit 24 directly. The sampled input signal 1 is compared by the comparator array 20 to produce an lower-digit result in the same way as the first embodiment. The output circuit 24 is the same as combination of the output circuit 10a and 10b of the first embodiment which converts a thermometer-code data into a binary data in the same manner as the first embodiment.

Figure 7:
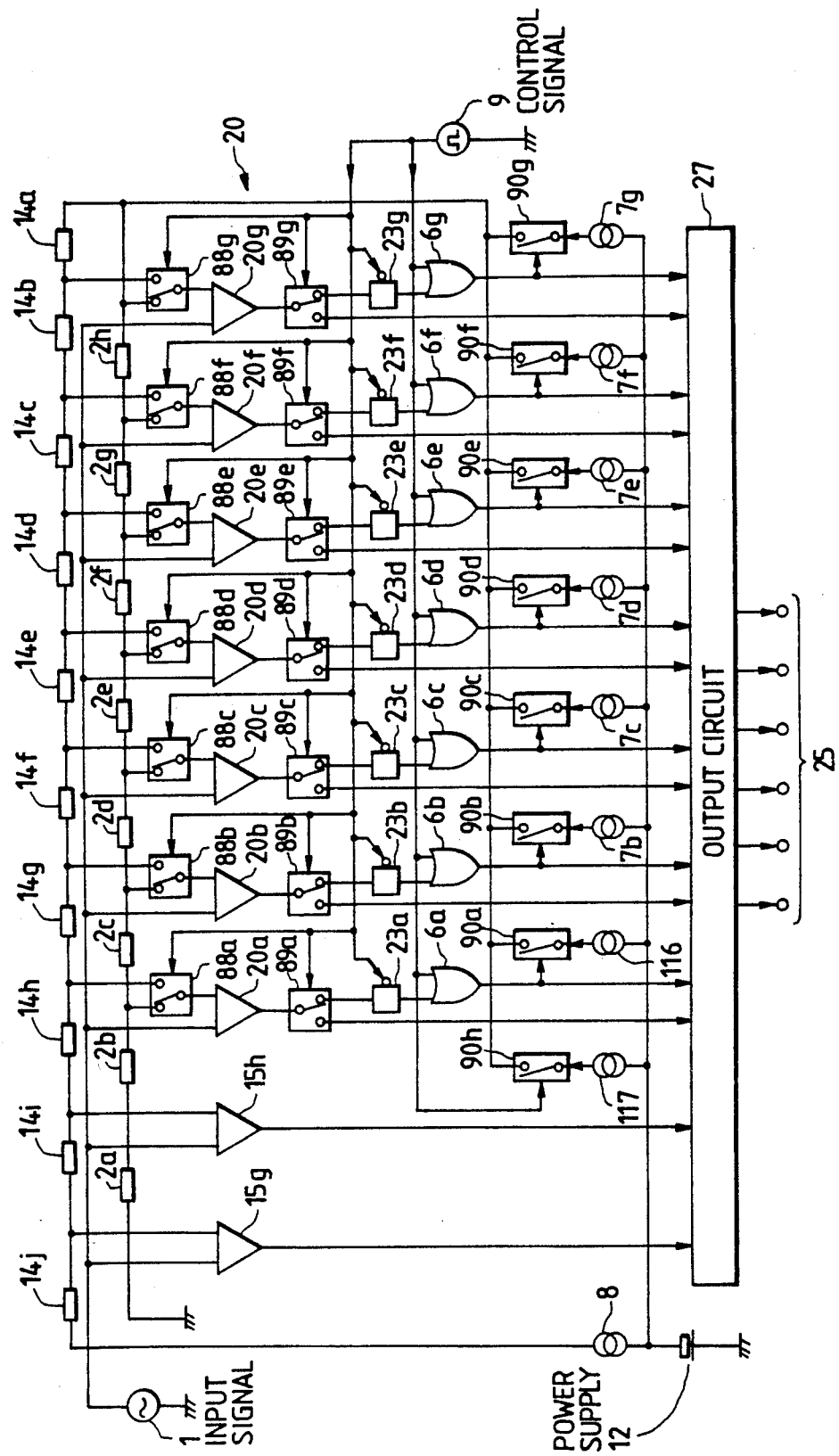
FIG. 7 is a block diagram of a serial-parallel type a/d converter of a fourth embodiment of the present invention.
Figure 8:
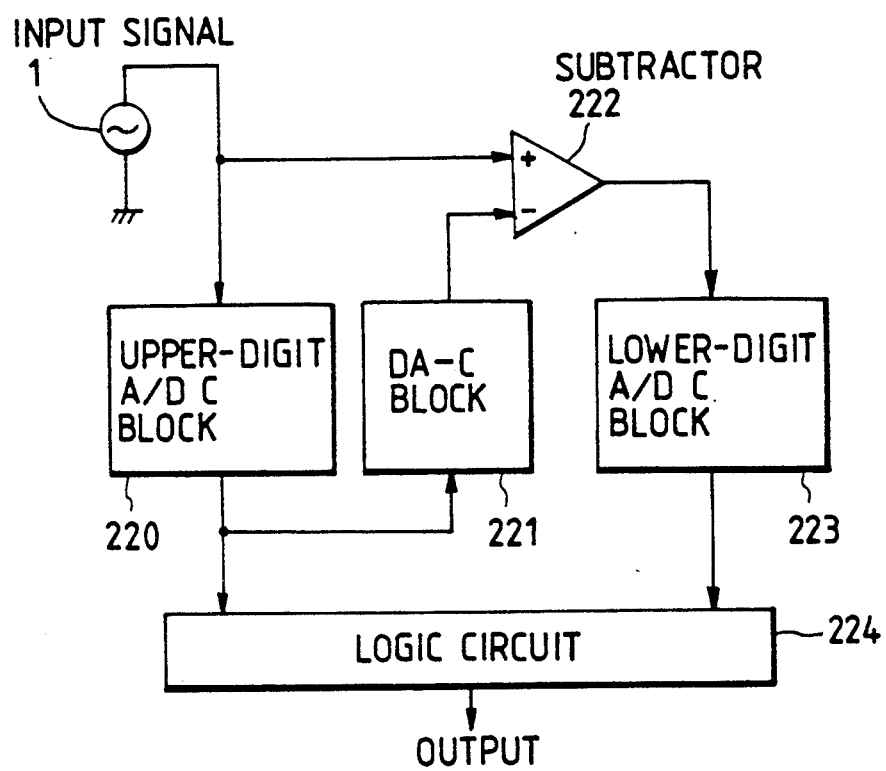
FIG. 8 is a block diagram of a prior art serial-parallel a/d converter.

FIG. 7 is a block diagram of a serial-parallel type a/d converter of a fourth embodiment of the invention. In FIG. 7, fundamental structure and operation of this a/d converter are the same as those of the second embodiment except that the fourth comparator array 15 is not used and switches 89a to 89g and 88a to 88g are provided. This is because comparators 20a to 20g are commonly used at upper-digit and lower-digit conversions by selecting upper-digit or lower-digit reference potentials for the comparators 20a to 20g. The switches 88a to 88g and 89a to 89g respond to the control signal 9 which is the same signal as the second embodiment.

At first step, switches 88a to 88g transfer reference potentials from reference resistors 2a to 2h respectively and switches 89a to 89g transfer output signals from the comparators 20a to 20g to latches 23a to 23g and then the sampled input signal is compared by the comparator array 20 to produce an upper-digit result in the same way as the first embodiment.

At second step, the switches 88a to 88g switch over in response to the control signal 9 and then switches 88a to 88g transfer reference potentials from reference resistors 14a to 14h respectively and switches 89a to 89g transfer output signals from the comparators 20a to 20g to output circuit 27 directly. The sampled input signal 1 is compared by the comparator array 20 to produce an lower-digit result in the same way as the second embodiment. The output circuit 24 is the same as combination of the output circuit 18 and 19 of the first embodiment which converts a thermometer code data into a binary data in the same manner as the second embodiment.

As mentioned above, an a/d converter according to this invention can accurately produce converted data of lower-digit without a subtractor provided to the prior art a/d converter and convert an input signal into a digital data at higher speed than the conventional a/d converter because no operational amplifier as a subtractor is used. Further, the reference resistor array for upper-digit conversion and that for lower-digit conversion are produced under an equivalent process with each resistor of these resistor arrays having similar dimensions. Also the current source array for upper-digit conversion and the current source for lower-digit conversion can be made with those current sources having substantially the same current intensity capacity as each other because they are produced under the same process such as a photolithographic process. Therefore, the a/d converter according to the invention has a high accuracy with no adjusting and provides a structure suited for an integration circuit. Moreover, this a/d converter operates with low power consumption because this a/d converter comprises no d/a converting block 221 of the conventional serial-parallel type a/d converter. The number of current sources of this a/d converter is more than the conventional serial-parallel type a/d converter but total current required for generating the reference potential is the same as the conventional a/d converter. Further, a/d converters of the third and fourth embodiment have less comparators than a/d converters of the first and second embodiments and conventional serial-parallel type a/d converters because switches are provided for selecting reference potentials of lower-digit and upper-digit. Therefore, the second and third embodiment of the present invention provides lower size of chip of the circuit arrangement if the circuit is made on the chip and provides lower power consumption.

What is claimed is:

1. A serial-parallel type a/d converter comprising:
   (a) plural first comparators whose one input is supplied with an input analog signal to be converted into a digital signal for producing upper-digit signals of said a/d converter;
   (b) potential producing means responsive to a control signal and said upper-digit signals for producing and supplying plural first different potentials determined according to a first arithmetic progression with respect to a reference potential to respective another inputs of said first comparators when said control signal is of a first state, and for producing $N-1$ (N is a natural number) second different potentials determined according to a second arithmetic progression with respect to a potential determined in accordance with said upper-digit signals when said control signal is of a second state, common difference of said second arithmetic progression being $1/N$ of that of said first arithmetic progression; and
   (c) second comparators whose one input is supplied with said input signal, another inputs of said second comparators being supplied with said $N-1$ second potentials respectively for producing lower-digit signals of said a/d converter;
   wherein said potential producing means comprises:
   (i) a first potential divider including series-connected first resistors having a predetermined resistance respectively, said reference potential being applied to one end of the first potential divider, for producing said first different potentials;
   (ii) a current source array having plural first current sources for respectively producing a unit current;
   (iii) switching means having plural switches responsive to said upper-digit signals and said control signal for outputting a first current obtained from all said first current sources when said control signal is of said first state and outputting a second current selectively obtained from said first current sources in accordance with said upper-digit signals when said control signal is of said second state;
   (iv) a second potential divider including N series-connected second resistors having said predetermined resistance respectively, one end of the second potential divider being supplied with said second current, for producing said second different potentials; and
   (v) a second current source for producing and supplying said current to another end of said second potential divider.

2. A serial-parallel type a/d converter comprising:
   (a) plural first comparators whose one input is supplied with an analog input signal to be converted for producing upper-digit signals;
   (b) potential producing means responsive to a control signal and said upper-digit signals for producing and supplying plural first different potentials determined according to a first arithmetic progression with respect to a reference potential to respective another inputs of first comparators when said control signal is of a first state, and for producing $N-1+2Q$ (N and Q are natural numbers) second different potentials determined according to a second arithmetic progression with respect to a potential when said control signal is of a second state, common difference of said second arithmetic progression being $1/N$ of that of said first arithmetic progression, said potential given in accordance with said upper-digit signals and with $Q/N$;
   (c) $N-1+2Q$ second comparators whose one input is supplied with said input signal, another inputs of said $N-1+2Q$ second comparators being supplied with said second potentials respectively for producing lower-digit signals; and
   (d) logic means responsive to said upper-digit and lower-digit signals for producing an output signal of said a/d converter from said upper-digit and lower-digit signals without correction when a least significant digit of said upper-digit signal is consistent with said lower-digit signals and with said upper-digit signal corrected when said least significant digit is inconsistent with said lower-digit signals;
   wherein said potential producing means comprises:
   (i) a first potential divider including series-connected first resistors having a predetermined resistance respectively, said reference potential being applied to one end of the first potential divider, for producing said first different potentials;
   (ii) a current source array having plural first current sources for respectively producing a unit current of a predetermined current intensity I, a second current source for producing a current of a current intensity $(1-Q/N)I$, and a third current source for producing a current of a given current intensity $QI/N$;
   (iii) switching means having plural first switches respectively responsive to said output signals and said control signal for outputting a first current obtained from all said first current sources and said second current source when said control signal is of said first state and outputting a second current selectively obtained from said first and said second current sources in accordance with said upper-digit signals when said control signal is of said second state and a second switch responsive to said control signal for outputting a second current from said third current source when said control signal is of said first state;

(iv) a second potential divider including series-connected N+2Q second resistors having said predetermined resistance respectively, one end of the second potential divider being supplied with said first current, for producing said second different potentials; and (v) a fourth current source for producing and supplying said unit current to another end of said second potential divider.

3. A serial-parallel type a/d converter comprising:

(a) plural comparators whose one input is supplied with an input signal for producing upper-digit and lower-digit signals of said a/d converter; and (b) potential producing means responsive to a control signal and said upper-digit signals for producing and selectively supplying plural potentials determined according to a first arithmetic progression with respect to a reference potential to respective another inputs of said comparators when said control signal is of a first state and for producing and selectively supplying N−1 (N is a natural number) second different potentials determined according to a second arithmetic progression with respect to a potential determined in accordance with said upper-digit signals when said control signal is of a second state to output a lower-digit signal of said a/d converter, common difference of said second arithmetic progression being 1/N of that of said first arithmetic progression;

wherein said potential producing means comprises:

(i) a first potential divider including series-connected first resistors having a predetermined resistance respectively, said reference potential being applied to one end of the first potential divider, for producing said first different potentials;

(ii) a current source array having plural first current sources for respectively producing a unit current;

(iii) switching means having plural switches responsive to said upper-digit signals and said control signal for outputting a first current obtained from all said first current sources when said control signal is of said first state and outputting a second current selectively obtained from said first current sources in accordance with said upper-digit signals when said control signal is of said second state;

(iv) a second potential divider including N−1 series-connected second resistors having said predetermined resistance respectively, one end of the second potential divider being supplied with said second current, for producing said second different potentials; and (v) a second current source for producing and supplying said unit current to another end of said second potential divider; and (vi) plural second switches responsive to said control signal for selectively transferring said first and second potentials to said comparators respectively.

4. A serial-parallel type a/d converter comprising:

(a) N+2Q (N and Q are natural numbers) first comparators whose one input is supplied with an input signal for producing upper-digit and lower-digit signals;

(b) potential producing means responsive to a control signal and said upper-digit signals for producing and selectively supplying first potentials determined according to a first arithmetic progression with respect to a reference potential to respective another inputs of said first comparators when said control signal is of a first state, and for producing and selectively supplying N+2Q second different potentials determined according to a second arithmetic progression with respect to a potential when said control signal is of a second state, common difference of said second arithmetic progression being 1/N of that of said first arithmetic progression, said potential given in accordance with said upper-digit signal and with Q/N; and (c) logic means responsive to said upper-digit and lower-digit signals for producing an output signal of said a/d converter from said upper-digit and lower-digit signals without correction when a least significant digit of said upper-digit signals is consistent with said lower-digit signals and with said output signals corrected when said least significant digit is inconsistent with said lower-digit signals, to output upper-digit and lower-digit data of said a/d converter;

wherein said potential producing means comprises:

(i) a first potential divider including series-connected plural first resistors having a predetermined resistance respectively, said reference potential being applied to one end of the first potential divider, for producing said first potentials;

(ii) a current source array having plural first current sources for respectively producing a unit current of a predetermined current intensity I, a second current source for producing a current of a current intensity (1−Q/N)I, and a third current source for producing a current of a given current intensity QI/N;

(iii) switching means having plural first switches respectively responsive to said output signals and a control signal for outputting a first current obtained from all said first current sources and said second current source when said control signal is of said first state and selectively outputting a second current selectively obtained from said first and second current sources in accordance with said upper-digit signals when said control signal is of said second state and a second switch responsive to said control signal for outputting said current from said third current source when control signal is of said first state;

(iv) a second potential divider including series-connected N+2Q second resistors having said predetermined resistance respectively, one end of the second potential divider being supplied with said first current, for producing said second different potentials;

(v) a fourth current source for producing and supplying said unit current to another end of said second potential divider; and (vi) plural second switches responsive to said control signal for selectively transferring said first and second potentials to said comparators respectively.

* * * * *